(12) United States Patent
Khan et al.

(10) Patent No.: US 11,385,689 B2
(45) Date of Patent: Jul. 12, 2022

(54) INTEGRATED ELECTRONIC CARD FRONT EMI CAGE AND LATCH FOR DATA STORAGE SYSTEM

(71) Applicant: INTEL CORPORATION, Santa Clara, CA (US)

(72) Inventors: Jawad B. Khan, Cornelius, OR (US); Andrew Warrack Morning-Smith, Vancouver (CA); John Hung, Vancouver (CA); Michael D. Nelson, Mountain View, CA (US); Craig J. Jahne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/343,741

(22) PCT Filed: Oct. 26, 2016

(86) PCT No.: PCT/US2016/058768
§ 371 (c)(1),
(2) Date: Apr. 19, 2019

(87) PCT Pub. No.: WO2018/080466
PCT Pub. Date: May 3, 2018

(65) Prior Publication Data
US 2019/0286197 A1    Sep. 19, 2019

(51) Int. Cl.
*G06F 1/18*    (2006.01)
*F21V 8/00*    (2006.01)
(Continued)

(52) U.S. Cl.
CPC .......... *G06F 1/182* (2013.01); *G02B 6/0008* (2013.01); *G06F 1/183* (2013.01); *G06F 1/20* (2013.01);
(Continued)

(58) Field of Classification Search
CPC ......... G06F 1/182; G06F 1/183; H05K 1/181; H05K 7/1427; H05K 2201/10159; G02B 6/0008
See application file for complete search history.

(56) References Cited

U.S. PATENT DOCUMENTS

| 5,398,161 A | 3/1995 | Roy |
| 6,278,617 B1 * | 8/2001 | Yang .................... H05K 9/0018 361/740 |

(Continued)

FOREIGN PATENT DOCUMENTS

JP    2004012672 A    1/2004

OTHER PUBLICATIONS

International Preliminary Reporton Patentability received for PCT Patent Application No. PCT/US2016/058768, dated May 9, 2019, 10 pages.

(Continued)

*Primary Examiner* — Rockshana D Chowdhury
*Assistant Examiner* — Douglas R Burtner
(74) *Attorney, Agent, or Firm* — Alliance IP, LLC

(57) ABSTRACT

An integrated electronic card front EMI cage and latch is described that is suitable for use in a data storage system. In an example a latch module for an electronic component housing has a latch housing having an arm with an attachment point to fasten the latch housing to an end of the housing and an EMI cage having a front body and a plurality of fingers extending from the front body, the front body being held to the end of the housing by the latch housing and the fingers being configured to be outside an exterior of the housing on at least two sides of the housing to block electromagnetic interference from passing along the at least two sides of the housing.

13 Claims, 8 Drawing Sheets

(51) Int. Cl.
*G06F 1/20* (2006.01)
*H05K 1/02* (2006.01)
*H05K 1/18* (2006.01)
*H05K 7/14* (2006.01)
*H05K 7/20* (2006.01)

(52) U.S. Cl.
CPC .......... *H05K 1/0203* (2013.01); *H05K 1/181* (2013.01); *H05K 7/1427* (2013.01); *H05K 7/2039* (2013.01); *H05K 2201/10159* (2013.01)

(56) References Cited

U.S. PATENT DOCUMENTS

| | | | |
|---|---|---|---|
| 6,325,636 B1 | 12/2001 | Hipp et al. | |
| 6,661,651 B1* | 12/2003 | Tanzer | G06F 1/187 |
| | | | 361/679.33 |
| 7,298,612 B2 | 11/2007 | Malone | |
| 7,684,213 B2* | 3/2010 | Titus | H05K 7/1487 |
| | | | 361/818 |
| 8,045,328 B1 | 10/2011 | Chen | |
| 8,116,078 B2 | 2/2012 | Xu et al. | |
| 8,154,867 B2 | 4/2012 | Shearman et al. | |
| 8,547,825 B2 | 10/2013 | Armstrong et al. | |
| 8,843,771 B2 | 9/2014 | Wang | |
| 9,155,194 B1* | 10/2015 | Sullivan | H05K 3/366 |
| 9,213,485 B1 | 12/2015 | Hayes et al. | |
| 9,292,379 B2 | 3/2016 | Grimsrud et al. | |
| 9,396,065 B2 | 7/2016 | Webb et al. | |
| 9,666,995 B1* | 5/2017 | Phillips | H01R 13/6594 |
| 9,666,997 B1* | 5/2017 | Henry | H01R 13/659 |
| 9,748,700 B2* | 8/2017 | Qiao | H01R 13/658 |
| 9,820,416 B2* | 11/2017 | Miklinski | H01R 13/5202 |
| 9,831,610 B2* | 11/2017 | Sutter | H01R 13/6275 |
| 10,483,707 B2* | 11/2019 | Torres | H01R 13/46 |
| 2004/0073834 A1 | 4/2004 | Kermaani et al. | |
| 2004/0085722 A1* | 5/2004 | Tanzer | G06F 1/182 |
| | | | 710/302 |
| 2004/0252467 A1 | 12/2004 | Dobbs et al. | |
| 2004/0264145 A1 | 12/2004 | Miller et al. | |
| 2005/0170695 A1* | 8/2005 | Togami | G02B 6/4292 |
| | | | 439/607.24 |
| 2005/0259397 A1 | 11/2005 | Bash et al. | |
| 2007/0127206 A1* | 6/2007 | Wade | G06F 1/20 |
| 2007/0147746 A1 | 6/2007 | Adams et al. | |
| 2008/0043454 A1* | 2/2008 | Titus | H05K 7/1487 |
| | | | 361/818 |
| 2008/0144271 A1* | 6/2008 | Hartman | G06F 1/183 |
| | | | 361/730 |
| 2008/0145003 A1 | 6/2008 | Ice | |
| 2008/0205026 A1* | 8/2008 | Gallarelli | G11B 33/12 |
| | | | 361/818 |
| 2009/0043946 A1 | 2/2009 | Webb et al. | |
| 2009/0059551 A1* | 3/2009 | He | G06F 1/187 |
| | | | 361/818 |
| 2009/0098767 A1* | 4/2009 | Long | G02B 6/0008 |
| | | | 439/541.5 |
| 2009/0144568 A1 | 6/2009 | Fung | |
| 2010/0090663 A1 | 4/2010 | Pappas et al. | |
| 2011/0021045 A1* | 1/2011 | Tan | H01R 13/7172 |
| | | | 439/153 |
| 2013/0013956 A1 | 1/2013 | Armstrong et al. | |
| 2014/0016268 A1 | 1/2014 | Tsujimura et al. | |
| 2014/0063721 A1 | 3/2014 | Herman et al. | |
| 2014/0362515 A1 | 12/2014 | Pronozuk et al. | |
| 2015/0305206 A1 | 10/2015 | Fukuda et al. | |
| 2015/0355686 A1* | 12/2015 | Heyd | G11B 33/128 |
| | | | 361/679.31 |
| 2016/0073544 A1* | 3/2016 | Heyd | G06F 1/20 |
| | | | 361/679.31 |
| 2016/0308313 A1* | 10/2016 | Yang | G02B 6/0008 |
| 2016/0335220 A1* | 11/2016 | Breakstone | G06F 13/4068 |
| 2016/0364143 A1 | 12/2016 | Webb et al. | |
| 2017/0024275 A1 | 1/2017 | Grimsrud et al. | |
| 2017/0097484 A1* | 4/2017 | Teo | H05K 1/0274 |
| 2017/0214170 A1* | 7/2017 | Su | G02B 6/4284 |
| 2017/0261674 A1* | 9/2017 | Henry | G02B 6/0006 |
| 2017/0262029 A1 | 9/2017 | Nelson et al. | |
| 2020/0044393 A1* | 2/2020 | Nishikawa | H01R 13/641 |

OTHER PUBLICATIONS

Korean Intellectual Property Office—International Search Report of the International Searching Authority for International Application No. PCT/US2016/058768 dated Jun. 30, 2017, 4 pgs.
Korean Intellectual Property Office—Written Opinion of the International Searching Authority for International Application No. PCT/US2016/058768 dated Jun. 30, 2017, 8 pgs.
Final Office Action for U.S. Appl. No. 15/068,827 dated Dec. 20, 2017, 19 pages.
Final Office Action for U.S. Appl. No. 15/068,827 dated Feb. 3, 2020, 24 pages.
Final Office Action for U.S. Appl. No. 15/068,827 dated May 22, 2019, 24 pages.
International Preliminary Report on Patentability for International Application No. PCT/US2017/012859, dated Sep. 27, 2018, 11 pages.
International Search Report and Written Opinion for International Application No. PCT/US2017/012859, dated Apr. 20, 2017, 13 pages.
Non-Final Office Action for U.S. Appl. No. 15/068,827 dated May 17, 2017, 23 pages.
Non-Final Office Action for U.S. Appl. No. 15/068,827 dated Oct. 3, 2018, 25 pages.
Non-Final Office Action for U.S. Appl. No. 15/068,827 dated Sep. 10, 2019, 23 pages.

* cited by examiner

INTEGRATED ELECTRONIC CARD FRONT EMI CAGE AND LATCH FOR DATA STORAGE SYSTEM

CROSS-REFERENCE TO RELATED APPLICATIONS

This patent application is a U.S. National Phase application under 35 U.S.C. § 371 of International Application No. PCT/US2016/058768, filed Oct. 26, 2016, entitled "INTEGRATED ELECTRONIC CARD FRONT EMI CAGE AND LATCH FOR DATA STORAGE SYSTEM", the contents of which are incorporated herein by reference.

FIELD

The present description pertains to the field of data storage systems, and in particular to a system with an army of electronic cards to mount in an enclosure.

BACKGROUND

High capacity, high speed, and low power memory is in demand for many different high powered computing systems, such as servers, entertainment distribution head ends for music and video distribution and broadcast, and super computers for scientific, prediction, and modeling systems. The leading approach to provide this memory is to mount a large number of spinning disk hard drives in a rack mounted chassis. The chassis has a backplane to connect to each hard drive and to connect the hard drives to other rack mounted chassis for computation or communication. The hard disk drives connect using SAS (Serial Attached SCSI (Small Computer System Interface)), SATA (Serial Advanced Technology Attachment), or PCIe (Peripheral Component Interface express) or other storage interfaces.

While the spinning disk hard drive provides a large amount of storage at low cost, it has a high power consumption and high heat production. This is not significant for desktop computers with a single drive but when hundreds or thousands of drives are combined, then the power required to drive and cool the disks can be significant. NAND flash drive prices are coming down steadily while reliability and longevity is being improved. As a result, for many applications an AFA (All Flash Array) is used for either warm or cold storage applications or both.

Flash arrays are constructed at high volume in a 2.5" hard disk drive form factor and in a M.2 module form factor. These form factors have been specifically developed for notebook computers and provide an amount of storage, speed, power consumption and cost that is best suited for notebook computers. An AFA could be built using these standard form factor SSDs (Solid State Drives). When off the shelf 2.5" SSDs are used for a large capacity solution and they are vertically mounted there is a minimum rack-mount chassis size of 2U or 3U due to the size of the drives, the mounting connectors and the need for airflow. M.2 SSDs have a lower capacity and so require many more devices and connectors.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

A memory system is described that provides dense All Flash Array (AFA) designs. The system has front serviceability of an array of flash storage modules, as well as excellent airflow and EMI (Electro-Magnetic Interference) characteristics. Front serviceable storage modules avoid the need for the chassis to be slid out of the rack because there is no need to open the top cover to service the storage modules. Yet the system may still be mounted to a sliding carrier to allow for other modules to be serviced without removing the chassis, such as fans, interconnects, controllers, switches, and computing modules.

The described dense memory storage boxes have high airflow, heat dissipation and storage density using a thin and long SSD form factor. This SSD will be referred to herein as a "Ruler Storage Module", "RSM" or "ruler". Several RSMs may be used in a 19" wide rack-mount SSD system. They may be placed in a single row multiple column arrangement, which helps guide the airflow and provides maximum surface area for the NAND media or in any other suitable arrangement.

Each RSM may be removed independently of the others for service, inspection, or repair by releasing a latch. The latch provides a connector to hold the RSM in place in the chassis and also a handle to pull the RSM out of the chassis. The latch may be integrated with a front EMI cage and a status display which allows the RSM to be protected from external interference and monitored. The integrated front EMI cage may be configured to integrate with a housing and heat spreader to provide a simple integrated serviceable unit for each RSM.

Figure 1:
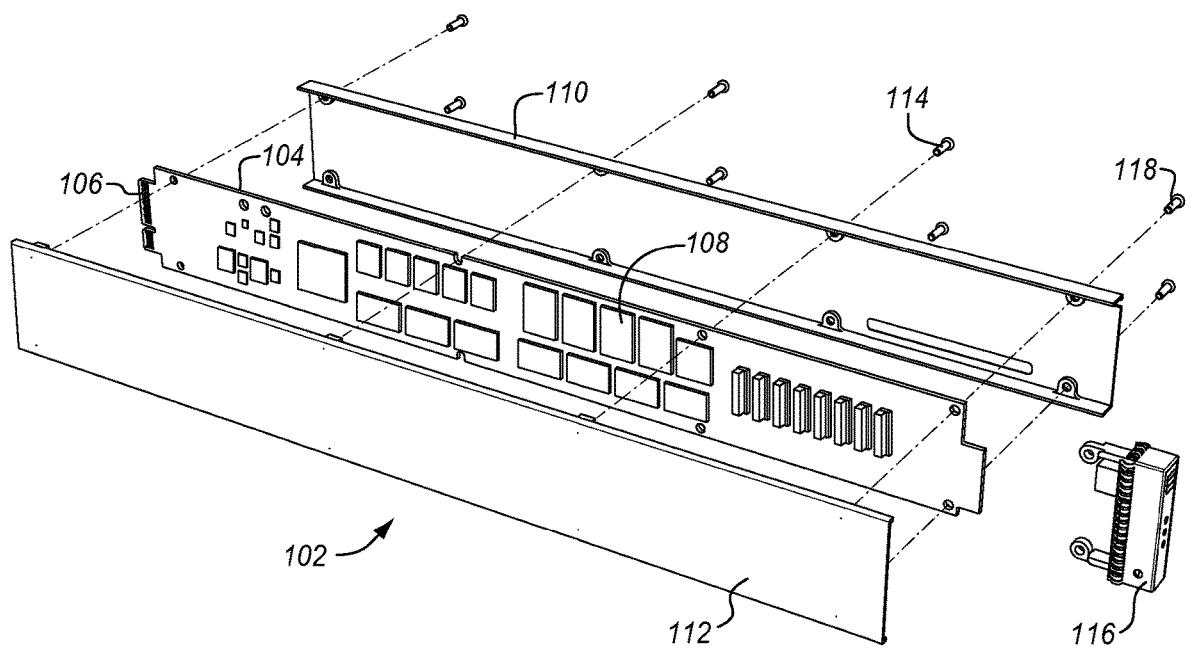
FIG. 1 is an exploded isometric diagram of an electronic component housing and latch module according to an embodiment.

FIG. 1 is an exploded isometric diagram of an example memory module such as an RSM with a latch module having an integrated EMI cage and latch. The RSM 102 is built on a printed circuit board (PCB) 104 with wiring layers and an edge connector 106 although other substrates may be used. The edge connector fits into a socket or cable connector to receive power and to send and receive data and control to and from the RSM although other types of connectors in different configurations or multiple connectors may be used. In this example, the edge connector is vertical so that the RSM is installed and removed with a horizontal movement. This allows the RSM to be installed and removed from the front of a chassis or enclosure without any vertical motion or top access.

Memory or storage components 108 are attached to the PCB. In this example, the storage is shown as multiple chips attached with surface mount technology (SMT) to the PCB, however other types of storage components, such as magnetic or optical devices may be used. The chips may contain flash memory, PCM (Phase Change Memory), RRAM (Resistive Random Access Memory), or any other type or combination of memory. The PCB also carries interface components near the edge connector and passive components on the opposite end. Various other components including power supply, buffer, interface, system management, communication, etc. may be mounted to the PCB, depending on the functions of the RSM and the nature of the memory carried by the RSM.

The PCB may carry multiple memory chips e.g. eighteen or more chips mounted to one side of the PCB structure. There may be more or fewer depending on the application. Each memory chip generates heat with use and consumes power with read and write operations. The number of chips may he determined based on power, cost, heat, and capacity budgets. In some embodiments 3D NAND flash memory chips are used. However, other types of solid state memory may be used including PCM (Phase Change Memory), STTM (Spin Transfer Torque Memory), magnetic, polymer, and other types of memory.

The memory card further includes memory controllers to control operations, mapping, and read and write between the edge connector and the memory chips. Fan out hubs may be used to connect the memory controllers to the cells of each memory chip. Buffers may also be used to support write, read, wear leveling, and move operations.

The PCB may be configured to support more memory chips on the other side or only one side may be used, depending on the budget for power, heat, and capacity. The memory card may have heat sinks and exposed chip package surfaces as shown, or may be covered with one or more larger heat sinks or heat spreaders as well as the top plate and the back plate.

The particular configuration and arrangement of the chips may be modified to suit requirements of different chips and to match up with wiring routing layers within the PCB. The buffers may be a part of the memory controllers or in addition to those in the memory controllers. There may be additional components (not shown) for system status and management. Sensors may be mounted to the RSM to report conditions to the memory controller or through the connector to an external controller or both.

The PCB is enclosed inside a housing that has a back plate 110 and a front plate 112. One or both of the plates may serve as heat spreaders to distribute heat from PCB components to the housing exterior. The plates are held together with screws or any other suitable fasteners 114. The fasteners are removable to allow the PCB to be accessed for service, maintenance, and upgrades. In this example, the screws extend through insulated holes in the PCB and attach to the front plate to hold the front plate against the back plate. An integrated latch module 116 with an EMI cage and a latch is attached to the front of the housing and is also held in place with fasteners 118 such as screws through the latch and the front and back plate. The latch fasteners 118 distribute any force applied at the latch through the front and back plate of the housing. This reduces stress on the PCB and the rear vertical edge connector 106. In this example, the fasteners attach the latch module to the housing and not to the PCB. The PCB is attached to the housing separately from the latch module. As a result, stresses applied to the latch module do not affect the PCB directly.

Figure 2:
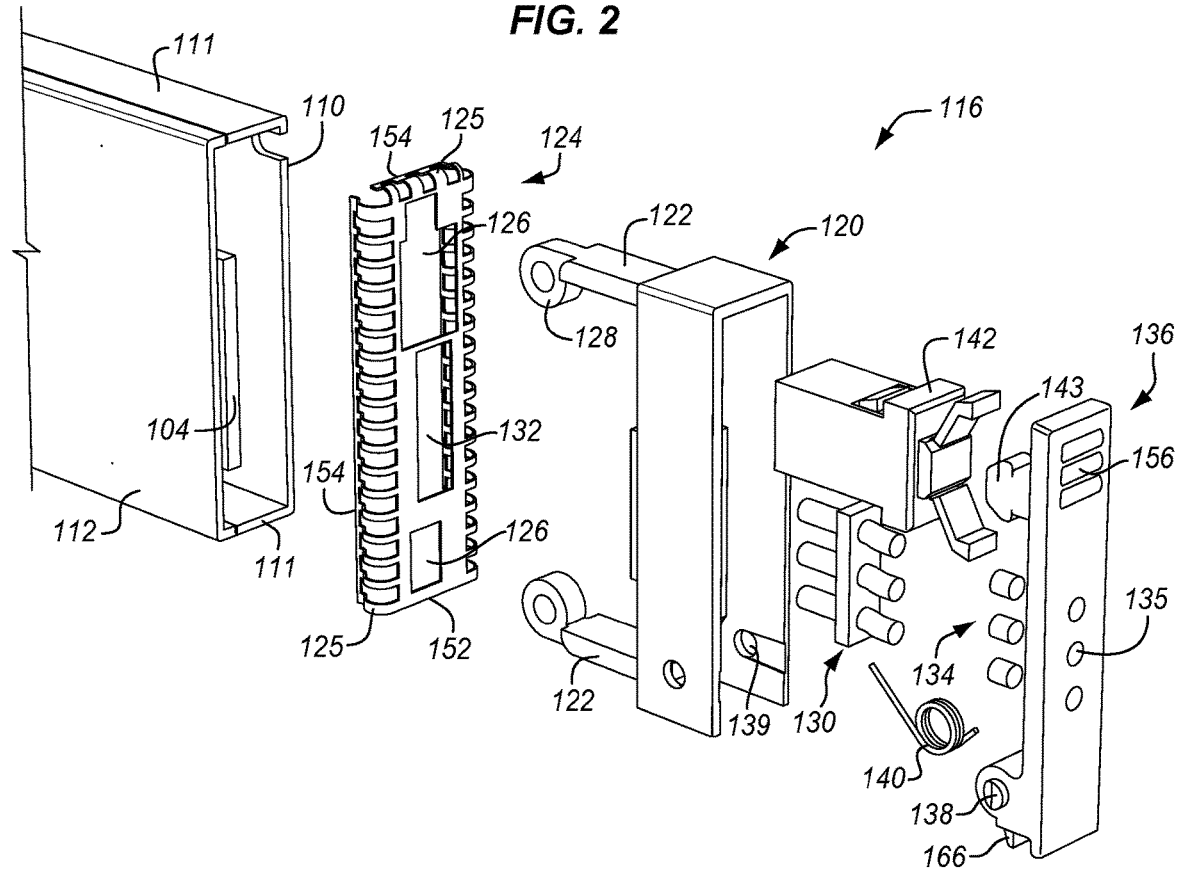
FIG. 2 is an exploded isometric diagram of a latch module and an assembled housing according to an embodiment.

FIG. 2 is an exploded isometric diagram of the integrated latch module 116 and the housing 110, 112. As shown, the PCB 104 is surrounded by the back 110 and front 112 plates of the housing. In this example, the back plate 110 has side walls 111 above and below the PCB that extend around the PCB. The front plate 112 rests against these side walls when attached with the fasteners 114. The housing is made of a conductive material such as aluminum or a carbon impregnated polymer so that it forms an electrostatic cage. The front plate may also function as a heat spreader or radiator to disperse heat generated by the memory chips and other components on the PCB. Other approaches may alternatively or additionally be used such as heat pipes, fins, radiators, and liquid cooling systems.

While the back plate is shown as surrounding the PCB, this may not be necessary. The top and bottom of the housing may he fully or partially removed, fully or partially exposing the PCB. The front or back plate or both may also be made substantially smaller than shown, exposing some or all of the PCB. In some embodiments, an EMI cage or shield is not necessary for the multiple parallel memory cards. While the front EMI cage 116 protects the memory and related controllers from external interference and protects external components from interference from the internal memory and controller chips, the different PCBs within an enclosure may be left unprotected from interference from each other. In such a case, the back plate may be in the form of a structural frame or a heat spreader that does not cover the chips and other components on the PCB. As a further alternative, the front and back plates may be eliminated completely. The latch module then attaches to the PCB which provides the structure for the memory system.

The latch module has a conductive EMI cage 124 that attaches over the front opening of the housing. The EMI cage may be formed of any of a variety of different conductive materials, such as steel, aluminum, copper, metal graphite filled polymers and resins, etc. It also has a latch housing 120 that fits into the EMI cage to hold the EMI cage in place, and a latch that attaches to the latch housing.

The EMI cage is configured to wrap over the exterior of the front edge of the housing. The EMI cage has an array of fingers 125 to cover the front of the housing. The fingers are evenly spaced and parallel between a front body 152 and a peripheral frame 154. The front body provides the physical structure to support the fingers and the peripheral frame. The fingers extend from the front body and curve to wrap around the exterior of the RSM housing. When assembled, the peripheral frame surrounds the housing on two or more sides. The fingers provide a barrier to electromagnetic interference but allow air to flow through the fingers across the back 110 and front 112 plates of the housing from the front of the RSM to the back where the edge connector is located.

With the front plate 112 thermally coupled to the PCB 104 the front plate acts as a heat sink for the PCB. In some embodiments, the back plate is thermally coupled to the front plate and also acts as a heat sink. In other embodiments the PCB is exposed because the back and front plates are much smaller. In this case, the air flow is across the PCB. The PCB may have fins, plates or other heat conducting structures to conduct heat into the airflow. The peripheral frame 154 of the EMI cage 124 may physically touch or abut the housing or simply be near the housing to serve as an EMI barrier.

The latch housing has upper and lower arms 122 that face the RSM housing. The arms extend through openings 126 in the front body of the EMI cage. Each arm has an attachment point, in this case a screw hole 128, at its end. When the arms are pressed through the openings of the front body, the fasteners 118 can pass through the attachment points to secure the latch housing against the front and back plates of the housing. This also traps the EMI cage between the latch housing and the housing to hold the EMI cage in place.

The latch 136 is movably attached to the latch housing. In this example, the latch has a pair of opposing pins 138 at one end that engage holes 139 in the latch housing to hold the latch in place and allow it to pivot about the opposing pins. A torsion spring 140 or any other biasing means is attached to the latch to bias the latch toward the closed position against the latch housing. The force of the spring holds the latch in an upright position in the latch housing. A push-push latch mechanism 142 is mounted to the latch housing. A tab 143 on the latch 136 mates with the latch mechanism. The latch, tab, and mechanism may interoperate in any of a variety of different ways. In one example, the latch is maintained in a vertical position by the torsion spring with the tab pressed against the latch mechanism.

Upon pressing the latch against the latch mechanism, the latch mechanism presses the tab away from the latch housing and toward a user. The user is then able to grab the latch and pull it downward against the force of the torsion spring. The latch serves as a handle for pulling the RSM out of an enclosure. Upon pushing the latch against the latch mechanism again, the latch mechanism moves back allowing the latch to again rest in the original vertical position.

The latch includes a ribbed surface 156 to indicate a position to push the latch against the latch mechanism. The ribs serve as a grip at one end of the latch opposite the pivot point 138 to improve a user's hold on the latch when the latch is pulled down. The latch also has a hook 166 at the bottom and displaced from the pins. Rotating the latch causes the hook to move relative to the pivot pins 138. In this example, pulling the top of the latch away from the latch mechanism will rotate the hook up into the latch mechanism, whereas pushing the latch back toward the latch mechanism will push the hook downwards to protrude down from the housing. In other words, the latch grip 156 is on one side of the pivot pin 138 and the hook is on an opposite side of the pivot pin so that moving the latch grip in one direction moves the hook in the opposite direction. The hook is used to lock the housing into an enclosure and to release the housing as described in more detail below.

An optional display system may also be used. In this example, an array of light pipes 130 is mounted to the latch housing 120. A corresponding set of light pipes 134 is attached to the latch. The latch has a diffuser array positioned to align with the end of each light pipe. An array of LEDs (Light Emitting Diodes) or another light source (not shown) are mounted to the PCB 104 and positioned to he aligned with the light pipes 130 of the latch housing. When an LED is illuminated, the light from that LED is conducted through the two arrays of light pipes 130, 134 and impinges on the diffusers 135 of the latch. This allows the LEDs to be observed from the front of the housing. In addition, no electrical or physical connection between the PCB and the latch is required. When the latch is pulled down the light pipes will be exposed.

Figure 3:
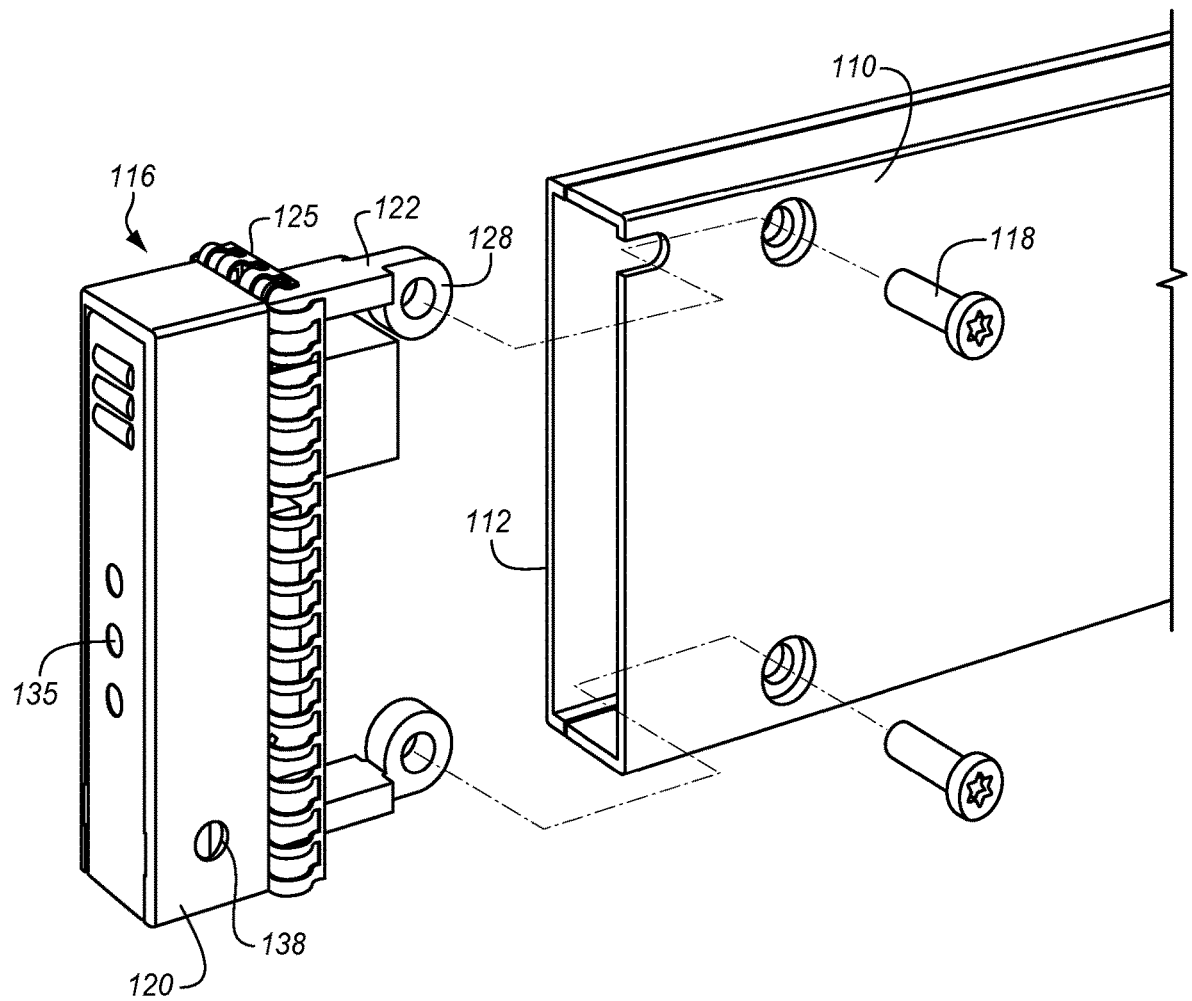
FIG. 3 is an exploded isometric diagram of attaching the latch module to the housing according to an embodiment.

FIG. 3 is an isometric diagram of the integrated latch 116 fully assembled to show how it is installed between the back 110 and front 112 plates of the housing. As shown, the aims 122 of the latch housing 120 are inserted into the housing. The attachment points 128 are aligned with corresponding attachment points of the housing and fasteners 118 are inserted through the housing and the latch housing arms to secure the latch housing in place. The EMI cage 125 is then positioned between the latch and the housing.

Figure 4:
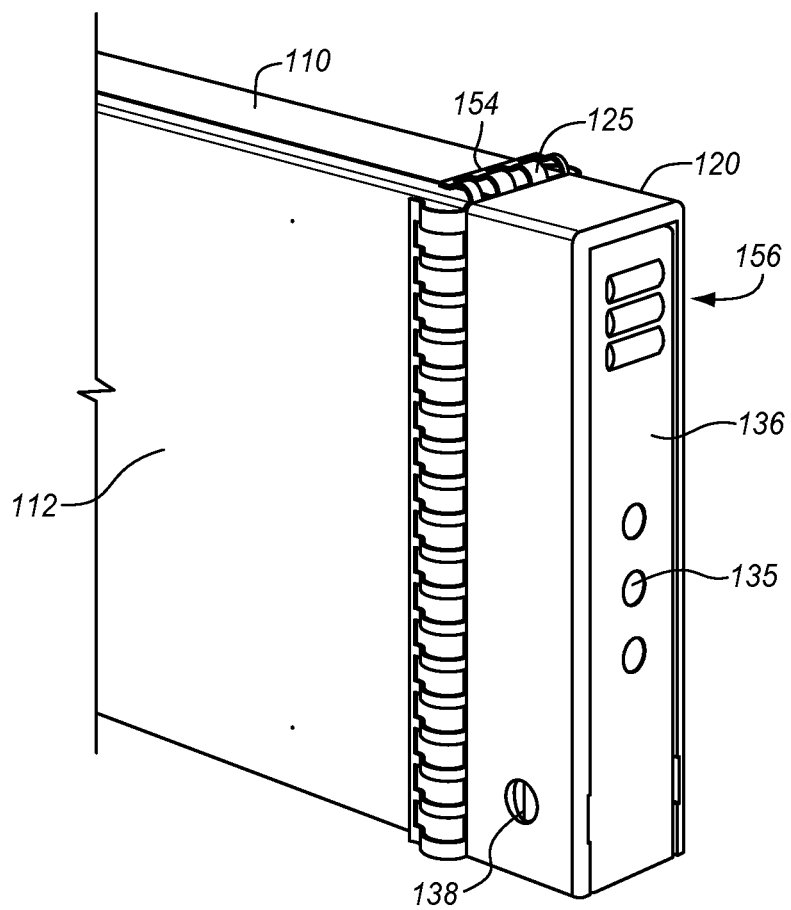
FIG. 4 is an assembled isometric diagram of a portion of the electronic component housing and latch module according to an embodiment.

FIG. 4 is an isometric diagram of the front of a housing 110, 112, with an integrated latch 120 attached to the front in the manner shown in FIG. 3. Any status indication as light from the diffusers 135 is clearly visible through the front of the latch 136. The latch has a ribbed surface 156. Pressing this surface presses the latch against the push-push latch mechanism 142 as described above to push the latch out. The user can then grab the latch pull it down to pivot about the pivot pins 138. The latch then can serve as a handle to pull the housing. This view shows the EMI cage 125 installed around the outside of the housing. The outer peripheral frame 154 rests on or near the outside of the back 110 and front plates 112. This shields any EMI (Electromagnetic interference) that may enter or exit between the plates.

Figure 5:
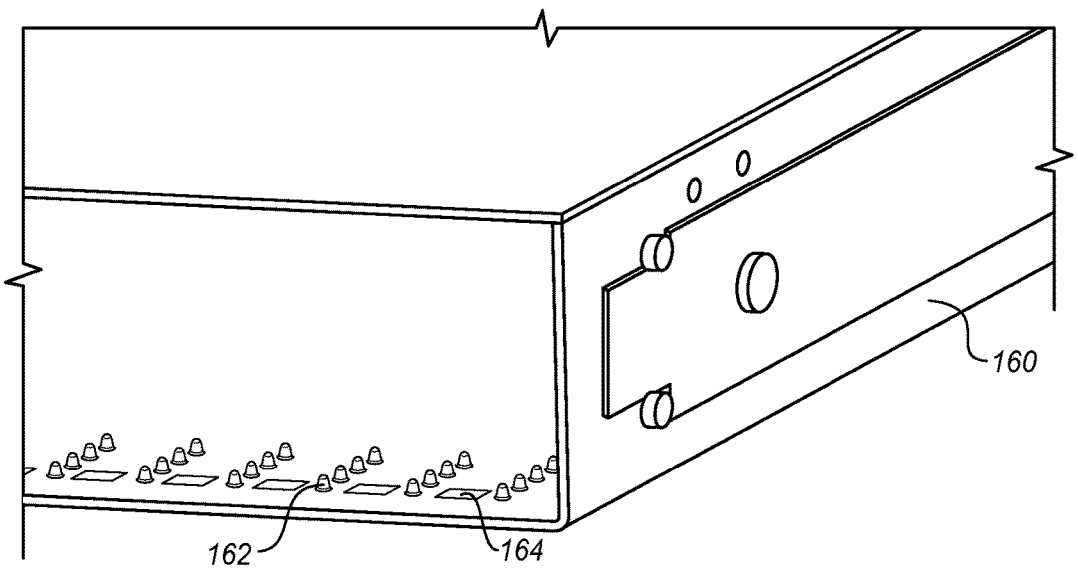
FIG. 5 is a diagram of a portion of a rack mount enclosure for carrying a parallel array of housed memory units according to an embodiment.

FIG. 5 is a diagram of a portion of a rack mount chassis or enclosure 160 for carrying a parallel array of housed memory units such as the RSM as shown in FIG. 1. The enclosure has a front opening to receive the memory enclosures. There are rows of tabs 162 extending from front to back on the top and bottom surfaces of the enclosure. These guide each memory enclosure as it is pushed into the enclosure. The tabs will also roughly align the rear edge connector so that it slides into a mating slot in the back of the enclosure.

The enclosure 160 also has a slot 164 near the front of the enclosure between each pair of rows. The slot receives a hook on the enclosure. When the hook is engaged with the slot, then the RSM is held in place in the enclosure. When the hook is released from the slot, then the memory enclosure may be pulled out or pushed in.

Figure 6:
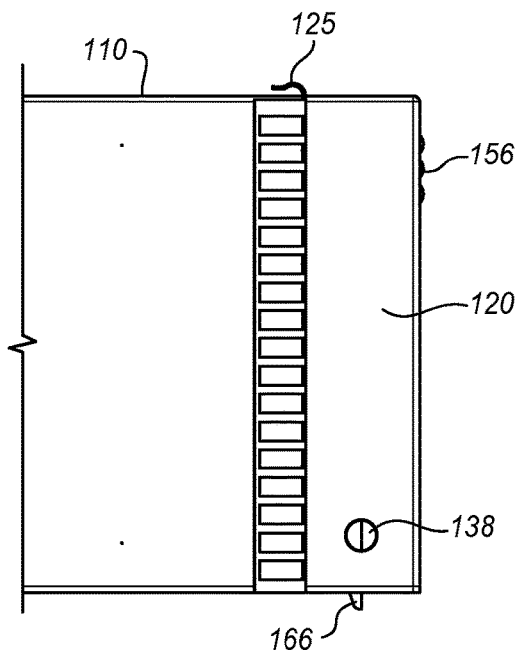
FIG. 6 is a side plan view of a portion of a housed memory unit with a closed latch according to an embodiment.

FIG. 6 is a side plan view of the RSM shown in FIGS. 1-4. In this view, the latch housing 120 is visible and the ribbed surface 156 of the latch can be seen. In addition, the hook 166 is visible protruding from the bottom of the latch housing. The hook is part of the latch 136 and held in place by the pivot pins 138. In this position, the hook will extend through the corresponding slot 164 in the enclosure to hold the RSM in place against the rear edge connector.

Figure 7:
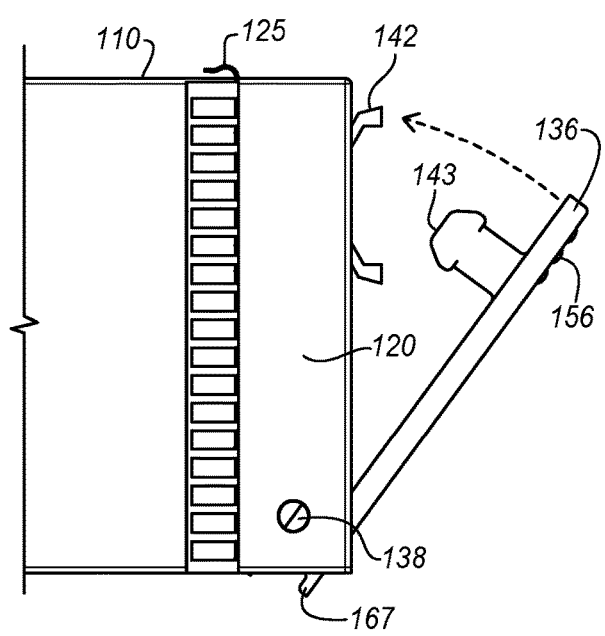
FIG. 7 is a side plan view of a portion of a housed memory unit with an open latch according to an embodiment.

FIG. 7 is a side plan view of the RSM as in FIG. 6 in which the latch has been pulled down. This may be done by pressing the latch 136 at the grip 156 against the latch push-push mechanism 143. The mechanism pushes the latch out so that a user may grab the top of the latch, for example at the grip 156. The user may then pull the latch down away from the latch housing 120. When the latch is pulled down and out, it is rotated about the pivot pins. The hook 166 will be rotated upward away from the bottom surface of the enclosure. As shown, with the latch down, the hook is completely retracted into the latch housing. This releases the memory housing. The enclosure can be installed with the latch rotated down and pressed against the rear edge connector guided by the alignment tabs 162. This allows the hook to be raised so that it will not contact the bottom of the enclosure. After the memory housing is in place and inserted into the rear electrical connector, then the latch is rotated up to the position shown in FIG. 6. This pushes the hook down into the slot in the enclosure, securing the memory in the enclosure.

In addition, the pivot point is configured so that the bottom edge 167 of the latch 136 moves downward as the latch is rotated. This bottom edge abuts the outer bottom edge at the front of the enclosure 160. As the latch is rotated, the bottom edge of the latch is pushed against the front of the enclosure. The motion of the latch drives the RSM forward away from the enclosure and if a rear edge connector is used it pulls the RSM away from the rear connector. The latch provides some leverage to pull the RSM forward because the latch acts as a lever arm for pushing the bottom edge against the housing. With the RSM extended a short distance ahead of the other RSMs a user may be able to also grasp the top, bottom, or sides, which may be difficult when the RSM is aligned parallel and close to the other RSMs.

Figure 8:
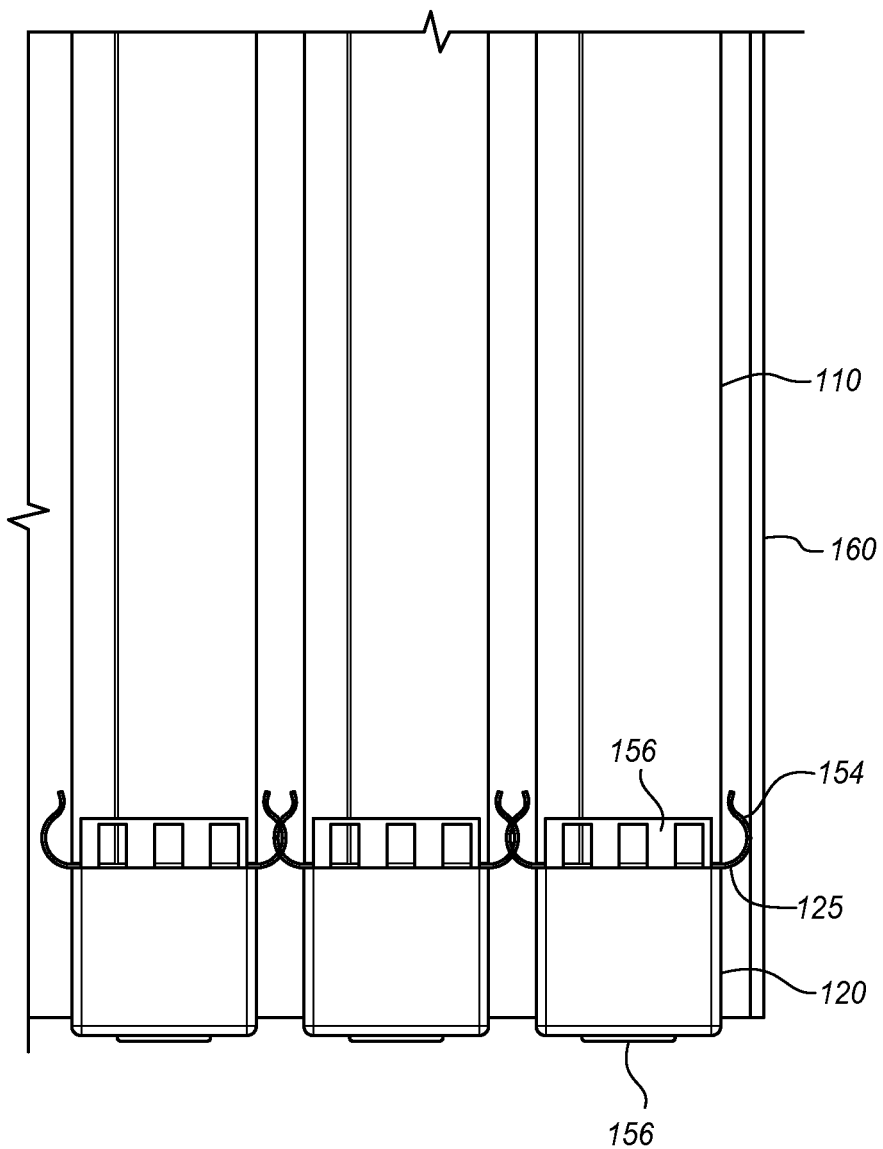
FIG. 8 is a top plan view of a set of housed memory units with latch modules mounted in an enclosure according to an embodiment.

FIG. 8 is a partial top plan view of a set of RSMs mounted in an enclosure. The top wall of the enclosure is removed to reveal the RSMs. Each RSM has a housing 110, 112 that is held in place inside of the enclosure. As shown in this view, the EMI cage 125 bends outward away from the housing. Each finger of the EMI cage extends outward away from the back and front plates, respectively, of the housing. The EMI cage accordingly, extends outward to contact the side walls of the enclosure on one side and the EMI cage of the neighboring housing on the other side. This provides an effective EMI shield at the front of the enclosure.

Any EMI is blocked from passing between the RSMs at the front where the cages are. This applies to EMI going into the enclosure or passing out of the enclosure. While the fingers are shown as being in direct contact with the enclosure and with each other, this is not necessary. It is enough that the fingers are proximate the interior walls of the enclosure. If the proximity of the fingers is close enough to meet the EMI wavelength criterion then the fingers will block any EMI from passing in either direction. In other words, if the fingers of one RSM are as close to the fingers of the neighboring RSM as the fingers are to each other, then the EMI will be blocked without the fingers actually touching. In the same way if the fingers are as close to the interior walls of the enclosure as the fingers are to each other, then the EMI will be blocked.

Figure 9:
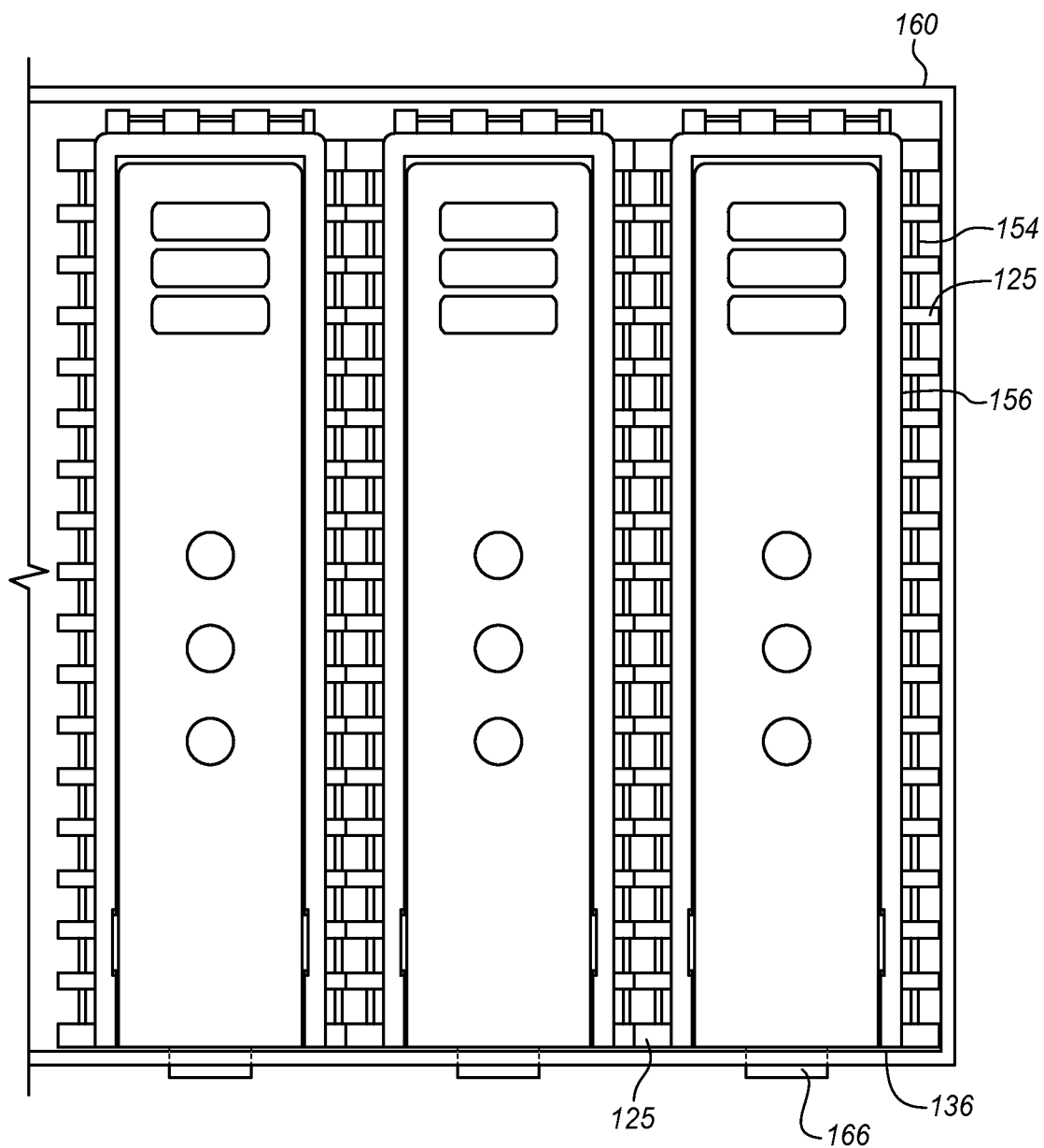
FIG. 9 is a front plan view of a set of housed memory units with latch modules mounted in an enclosure according to an embodiment.

FIG. 9 is a partial front plan view of a set of RSMs mounted in an enclosure. In this view, when multiple RSMs are placed side-by-side, the open airflow path between RSMs can be seen. This has an advantage of allowing for cooling air between the modules and to downstream components, such as processors, controllers, interfaces, and power supplies. When the memory is mounted to a carrier or when there is a front EMI cover plate, then airflow can be blocked. The EMI cage 125 for the RSM at the end of the row contacts or conies very close to the adjacent side wall of the enclosure. On the other side and for the other RSMs, the EMI cages of each RSM contact or come sufficiently close to the EMI cage of the neighboring or adjacent RSM.

In addition, the fingers of each EMI cage are proximate the interior top wall of the enclosure to block EMI also at the top. At the bottom, there is no airflow and EMI is blocked by the front body of the EMI cage, the latch and other parts. The system may be configured for airflow only on one or two sides or an all sides with appropriate modifications to the EMI cage and the memory housing mounting system. The contact or closeness between adjacent EMI cages allows for an effective EMI shield at the front of the enclosure.

The tabs 166 at the bottoms of each latch 136 are also visible in this view. The tabs or hooks extend downward through the slots 164 in the bottom of the enclosure 160 to lock the memory modules in place. This view represents the front of a rack mount enclosure or other similar type of enclosure as it would be seen by a user. The latches 136 are visible from the front with ribbed contact surfaces 156. The status of each RSM may be quickly monitored and any module may be pulled for inspection or service with a push and then a pull on the appropriate latch.

Figure 10:
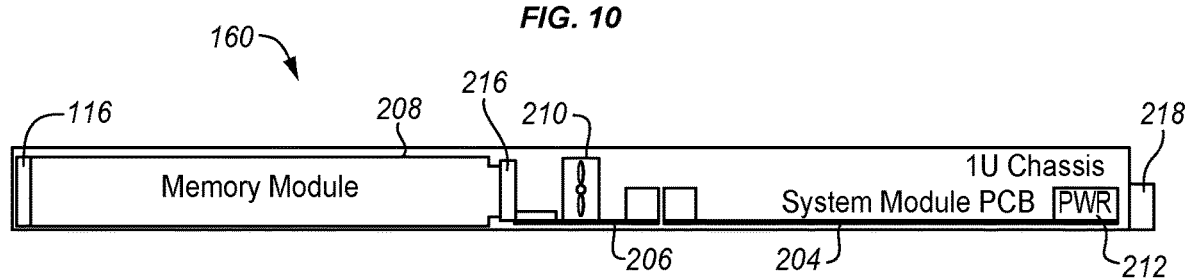
FIG. 10 is a cross-sectional side view diagram of a rack mount enclosure and housed memory unit according to an embodiment.

FIG. 10 is a cross-sectional side view diagram of an example of a rack-mount chassis and enclosure 160 to accommodate the RSM's as described herein. The system has an enclosure 160 which in this case is a 1U height rack mount enclosure. The enclosure is configured to mount in a particular type of standardized rack that has airflow from the front or left as shown in the diagram to the rear or right as shown in the diagram. The rear is configured for cabling. The enclosure is about 19" (483 mm) wide and 33" (840 mm) deep. The 1U form factor is 1.75" (44 mm) high. However, the particular width, height, and airflow direction may be adapted to suit other form factors.

The enclosure 160 carries a system module PCB (printed circuit board) 204 proximate the rear of the enclosure, a midplane PCB 206 near the middle of the enclosure and an array of RSMs 208 proximate the front of the enclosure. The memory modules are locked in place by the hooks 166 which extend through the enclosure 160 and are moved by pivoting a corresponding latch in a latch module 116.

An array of fans 210 is mounted behind the RSMs in the enclosure to draw air into the enclosure and pull it between and across the RSMs and push it to the rear of the enclosure. One or more power supplies 212 are mounted at the rear of the enclosure and may also have fans to draw air from the enclosure and push it out the rear of the enclosure. There may be additional fans along the chassis from front to rear. Rear fans may be used to pull air from the front across the chassis.

The parallel memory cards 208 extend from a position proximate the front of the enclosure toward the rear of the enclosure. An array of vertical connectors 216 couples to the rear connectors of the memory cards and connects the memory cards to a switch fabric of the midplane 206. The midplane may carry only a connector matrix to couple the power supply 212 and system module 204 to the memory cards. The midplane may also or alternatively be a compute zone which performs computations using values stored in the memory cards.

PCIe (Peripheral Component interconnect express) interconnect with an NVMe (Non-Volatile Memory express) storage protocol may be supported by the switching fabric 206 and an external interface 218 of the enclosure. In this case, NVMe is supported at the external interface and may also be supported in the connection to each RSM as well as within each RSM. Other PCIe interconnect protocols may alternatively be used. In addition SAS (Serial Attached Small computer system interface), SATA (Serial Advanced Technology Attachment), or other related, similar or different storage protocols may be used.

The system module 204 may be provided to suit different requirements, depending on the intended use of the system. The system module may be a data interface or a switching interface to connect the RSMs to the external connectors 218 through wired or wireless interfaces. It may include a memory controller to manage access to the RSMs and provide memory management and maintenance. It may include a data processing system to provide server, computing, and other functions between the RSMs and external devices.

The midplane 206 may also provide memory management and mapping between the RSMs and the system module. Each RSM also works as part of an airflow channel for guiding the air through the EMI cage, between the modules 208 and back to the system module 204.

Figure 11:
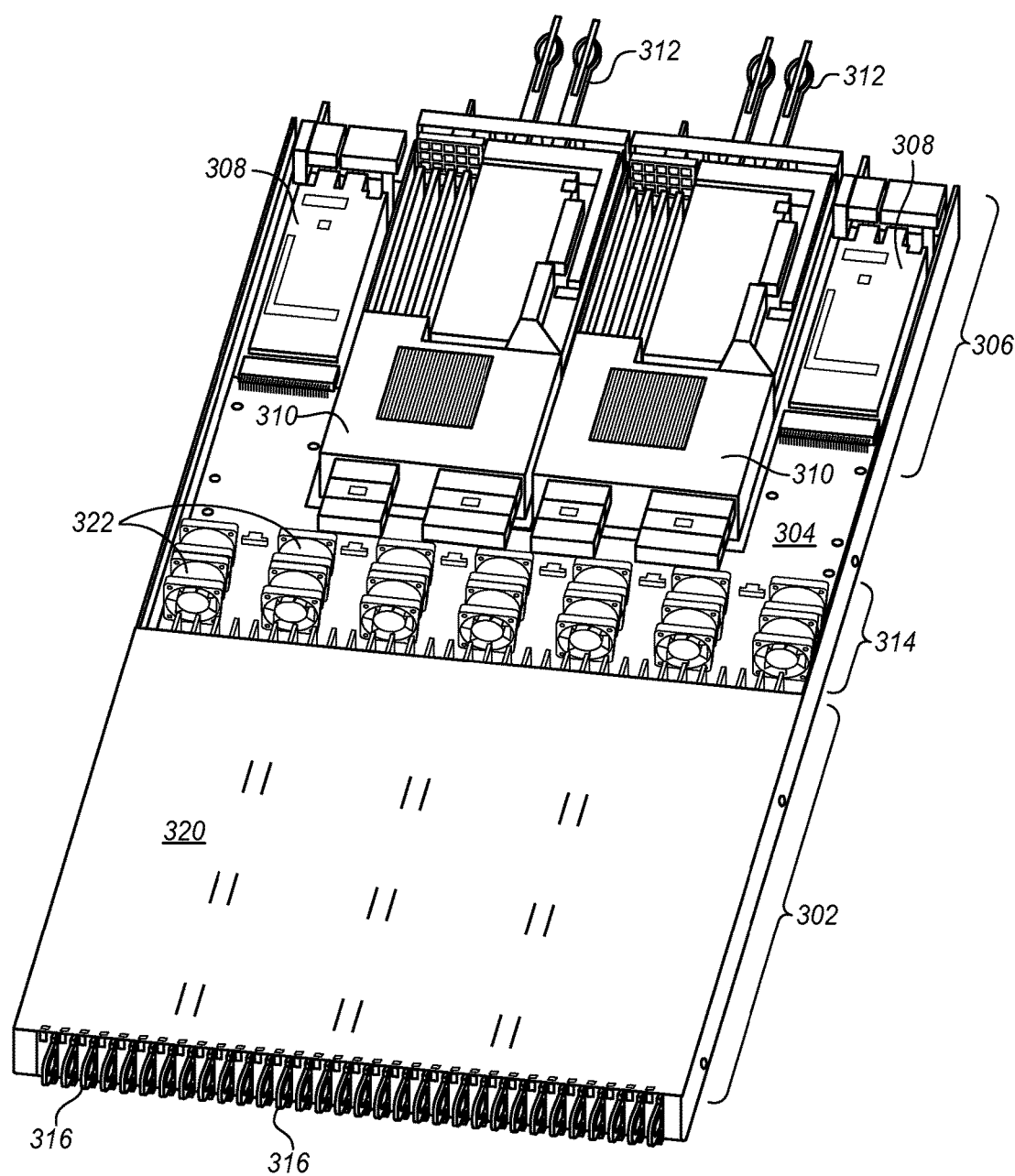
FIG. 11 is a top isometric view diagram of a rack mount enclosure and array of housed memory units according to an embodiment.

FIG. 11 is an isometric diagram of a chassis enclosure for a 1U rack height. This configuration may be augmented by an extra layer above or below for additional computing, switching, interface, memory, or power supply resources. The front of the chassis has a memory housing zone 302. In this example, the memory modules are covered by a top cover 320 which may also act to guide air across and between the rulers. A horizontal plane board in the form of a midplane 304 is directly beneath and coupled to the rulers. The rulers extend orthogonally upward from the top side of the midplane. A power supply and management zone 306 includes power supplies 308 on either side of the enclosure.

Compute modules 310 are placed side-by-side between the power supplies 308 and proximate the rear of the enclosure. The compute modules include external interface components that couple to cabling 312. The cabling connects the memory system to external components on another position on the rack or to another rack. The compute modules may be limited to serving and storing data and converting to and from different formats. Alternatively, the compute modules may be more powerful and able to perform simple tasks at low energy or more complex computation and modeling tasks, depending on the particular implementation.

A fan zone 314 is placed near the center of the enclosure with an array of fans 322 across the width of the chassis. There are seven fans in this example, but there may be more or fewer. The fans pull air from the front of the chassis between the memory rulers and then push it out the rear of the enclosure. They may be helped by the power supply and compute module fans, if any, and by additional rear fans, if any. The intermediate fan zone is placed between the memory rulers and the power supplies on the same side of the midplane as the memory rulers.

In this example there are no front fans shown. Front fans may be used to improve air flow or reduce the load on the middle fans. Instead the rulers have handles 316 at the front of the enclosure to allow access to the respective ruler. The latch modules 116 are obscured by the handles in this view. Fans may be mounted in front of these handles, in which case, the fans may be moved to access the rulers. The front handles allow for front access to the rulers without sliding the chassis forward in the rack as with a top mounted memory enclosure system.

Figure 12:
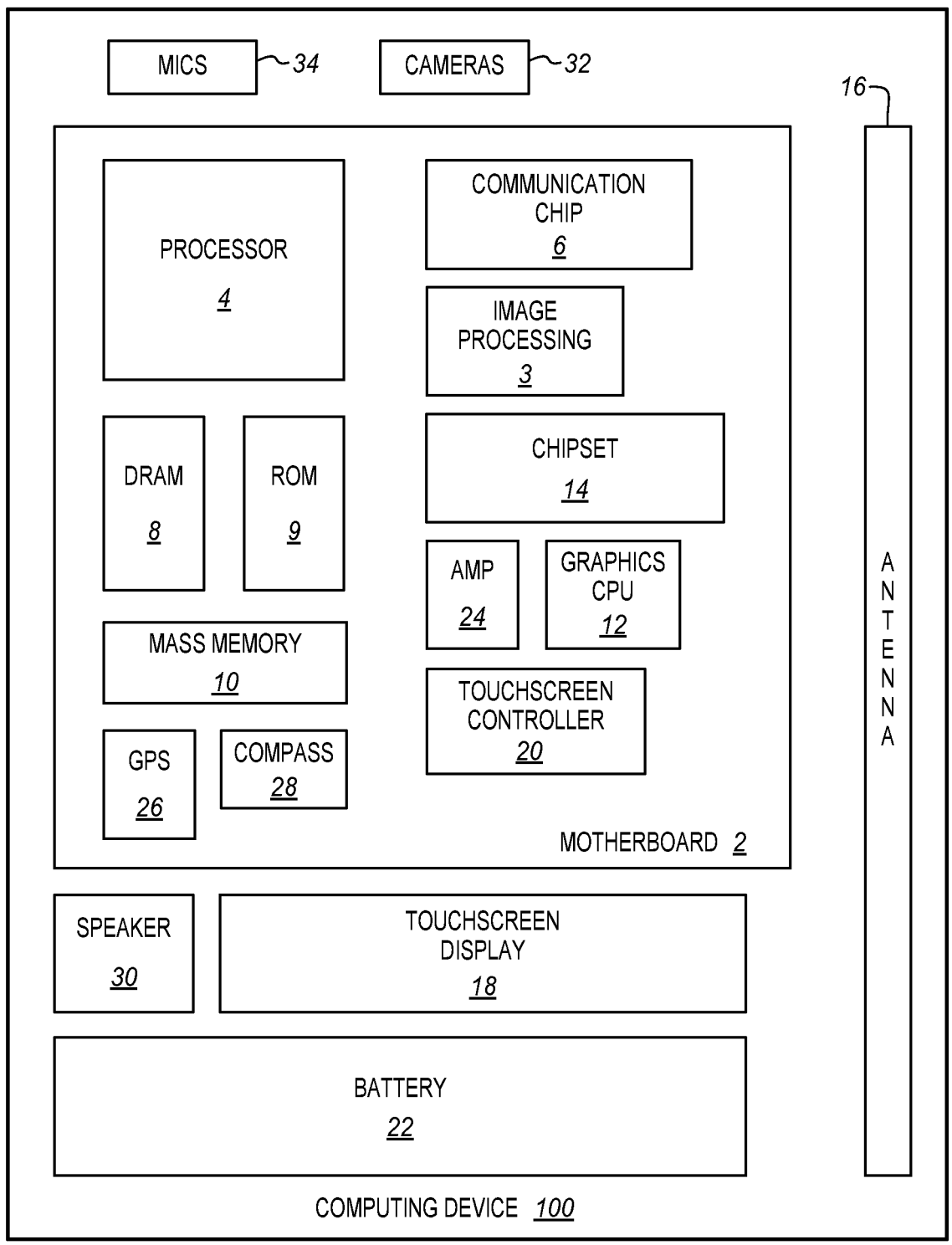
FIG. 12 is a block diagram of a computing device incorporating a memory system or capable of accessing a memory system according to an embodiment.

FIG. 12 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The computing system may be configured to be used as the system module. The computing system also reflects the entire rack-mount memory system where the mass memory is formed from multiple memory cards, as described. The memory system may have multiple iterations of the computing system within a single enclosure for each system module and also for the overall system.

In various implementations, the computing device 100 may be an entertainment front end unit or server, a music or video editing station or back end, a cloud services system, a database, or any other type of high performance or high density storage or computing system.

Embodiments may be include one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the min "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a latch module for an electronic component housing has a latch housing having an arm with an attachment point to fasten the latch housing to an end of the housing and an EMI cage having a front body and a plurality of fingers extending from the front body, the front body being held to the end of the housing by the latch housing and the fingers being configured to be outside an exterior of the housing on at least two sides of the housing to block electromagnetic interference from passing along the at least two sides of the housing.

In further embodiments the EMI cage further comprises a peripheral frame, the fingers extending between the front body and the peripheral frame, and wherein the peripheral frame is configured to be outside the exterior of the housing when installed on the housing.

In further embodiments the EMI cage front body has an opening through which the arm extends to attach to the housing.

In further embodiments the EMI cage front body is configured to abut the end of the housing and the latch housing arm extends into the housing to be attached to the housing by a fastener and to hold the front body to the end of the housing.

In further embodiments the EMI cage fingers extend away from the latch housing.

Further embodiments include a latch coupled to the latch housing having a closed position and an open position, the latch having a hook configured to engage an enclosure when the latch is in the closed position, the enclosure enclosing the housing and connecting to the electronic component.

In further embodiments the latch hook is configured to release the enclosure when the latch is in the open position.

In further embodiments the latch has a pivot pin connected to the latch housing to allow the latch to pivot between the open and the closed position about the pivot pin to move the hook.

In further embodiments the latch has a grip on one side of the pivot pin and wherein the hook is on an opposite side of the pivot pin so that moving the latch grip in one direction moves the hook in the opposite direction.

Further embodiments include a latch coupled to the latch housing having a closed position and an open position, the latch having an edge configured to engage an enclosure when the latch is moved to the open position so that movement of the latch moves the latch edge against the enclosure to push the housing away from the enclosure, the enclosure enclosing the housing and connecting to the electronic component.

Further embodiments include a spring to bias the latch module toward the closed position.

Further embodiments include a light pipe configured to receive light from an electronic component in the housing and to guide the light away from the housing to be viewed outside the housing.

Further embodiments include a latch coupled to the latch housing opposite the housing, the latch having a diffuser to receive and diffuse the light from the light pipe.

Some embodiments pertain to a removable memory device that includes a plate, a printed circuit board attached to the plate, a memory array attached to the circuit board to store data, a memory controller attached to the circuit board to control the operation of the memory array, and a latch module attached to the plate at an end of the plate, the latch module having a latch housing having an arm with an attachment point to fasten the latch housing to the end of the plate and an EMI cage having a front body and a plurality of fingers extending from the front body, the front body being held to the end of the housing by the latch housing and the fingers being configured to be outside the plate on at least two sides of the plate to block electromagnetic interference from passing along the at least two sides of the plate.

In further embodiments the plate is thermally coupled to the circuit board as a heat spreader.

Further embodiments include a second plate attached to the plate to form a housing and wherein the circuit board is covered by the housing.

Further embodiments include a light pipe configured to receive light from an electronic component of the circuit board and to guide the light away from the circuit board, a latch coupled to the latch housing opposite the circuit board, and a diffuser on the latch to receive and diffuse the light from the light pipe.

Some embodiments pertain to a memory system comprising:

an enclosure configured to mount in a rack, the enclosure having a front configured to receive airflow and a rear configured for cabling;

a horizontal plane board in the enclosure having a plurality of memory connectors and a plurality of external interfaces, the horizontal plane board having a first side and a second opposite side;

a plurality of memory cards, each having a connector to connect to a respective memory connector of the horizontal plane board, each memory card extending parallel to each other memory card from the front of the enclosure;

a plurality of housings each to cover a memory card; and a plurality of latch modules each attached to an end of a respective housing, each latch module having a latch housing having an arm with an attachment point to fasten the latch housing to the end of the housing and an EMI cage having a front body, a peripheral frame, and a plurality of fingers extending between the front body and the peripheral frame, the front body being held to the end of the housing by the latch housing and the peripheral frame being configured to be outside an exterior of the housing on at least two sides of the housing to block electromagnetic interference from passing along the at least two sides of the housing.

In further embodiments the fingers are configured to be proximate the enclosure sufficient to block EMI from passing the EMI cage.

Further embodiments include a latch coupled to the latch housing, a pivot pin connected to the latch housing to allow the latch to pivot between the open and the closed position about the pivot pin, a hook attached to the latch so that the hook pivots to engage the enclosure when the latch is in the closed position and pivots to release the enclosure when the latch is in the open position, and a spring to bias the latch module toward the closed position.

The invention claimed is:

1. A latch module for an electronic component housing comprising:
  a latch housing having an arm, the arm including an attachment point at an end thereof to fasten the latch housing to an end of the electronic component housing;
  an EMI cage having a front body, a peripheral frame, and a plurality of fingers extending between the front body and the peripheral frame, the front body defining an opening to receive the arm of the latch housing therethrough, the fingers being configured to engage at interior surfaces thereof an exterior of the electronic component housing on at least two sides of the electronic component housing to block electromagnetic interference from passing along the at least two sides of the electronic component housing, the peripheral frame to surround an exterior of the electronic component housing when the fingers engage the exterior of the electronic component housing; and
  a latch coupled to a front face of the latch housing such that it is movable with respect to the latch housing so as to define a closed position and an open position, the open position corresponding to the latch extending at an angle with respect to the front face of the latch housing, wherein the latch housing, the EMI cage and the latch are configured such that, when the latch housing is fastened to the electronic component housing, the arm of the latch housing extends through the opening of the front body of the EMI cage toward one or more electronic components within the electronic component housing, the EMI cage is held between the latch housing and the end of the electronic component housing, and the front body of the EMI cage is held against the latch housing.

2. The latch module of claim 1, wherein the EMI cage fingers extend away from the latch housing.

3. The latch module of claim 1, the latch having a hook configured to engage a slot defined in an enclosure when the latch is in the closed position, when the electronic component housing is in the enclosure, and when the latch housing is coupled to the electronic component housing, the enclosure to enclose the housing and to connect to the electronic component.

4. The latch module of claim 3, wherein the hook is configured to release the enclosure when the latch is in the open position.

5. The latch module of claim 3, wherein the latch has a pivot pin connected to the latch housing to allow the latch to pivot between the open and the closed position about the pivot pin to move the hook.

6. The latch module of claim 5, wherein the latch has a grip on one side of the pivot pin and wherein the hook is on an opposite side of the pivot pin so that moving the latch grip in one direction moves the hook in the opposite direction.

7. The latch module of claim 1, the latch having an edge configured to engage an enclosure when the latch is moved to the open position so that movement of the latch moves the latch edge against the enclosure to push the housing away from the enclosure, the enclosure enclosing the housing and connecting to the electronic component.

8. The latch module of claim 3, further comprising a spring to bias the latch toward the closed position.

9. The latch module of claim 1, further comprising a light pipe configured to receive light from an electronic component in the electronic component housing and to guide the light away from the electronic component housing to be viewed outside the electronic component housing.

10. The latch module of claim 9, the latch having a diffuser to receive and diffuse the light from the light pipe.

11. A memory system comprising:
  an enclosure configured to mount in a rack, the enclosure having a front configured to receive airflow and a rear configured for cabling;
  a midplane printed circuit board in the enclosure having a plurality of connectors;
  a plurality of memory cards, each having a connector to connect to a respective connector of the midplane printed circuit board, each memory card extending parallel to each other memory card;
  a plurality of memory card housings each to cover a respective one of the memory cards; and
  a plurality of latch modules each attached to an end of a respective memory card housing of the plurality of memory card housings, each latch module including:
    a latch housing having an arm, the arm including an attachment point at an end thereof to fasten the latch housing to the end of the respective memory card housing;
    an EMI cage having a front body, a peripheral frame, and a plurality of fingers extending between the front body and the peripheral frame, the front body defining an opening to receive the arm of the latch housing therethrough, the fingers being configured to engage at interior surfaces thereof an exterior of the respective memory card housing on at least two sides of the respective memory card housing to block electromagnetic interference from passing along the at least two sides of the respective memory card housing, the peripheral frame to surround an exterior of the respective memory card housing when the fingers engage the exterior of the respective memory card housing; and
    a latch coupled to a front face of the latch housing such that it is movable with respect to the latch housing so as to define a closed position and an open position, the open position corresponding to the latch extending at an angle with respect to the front face of the latch housing, wherein the latch housing, the EMI cage and the latch are configured such that, when the latch housing is fastened to the respective memory card housing, the arm of the latch housing extends through the opening of the front body of the EMI cage toward one or more electronic components within the respective memory card housing, the EMI cage is held between the latch housing and the end of the respective memory card housing, and the front body of the EMI cage is held against the latch housing.

12. The system of claim 11, wherein the fingers are configured to be proximate the enclosure sufficient to block EMI from passing the EMI cage.

13. The system of claim 12,
the latch including a pivot pin connected to the latch housing to allow the latch to pivot between the open and the closed position about the pivot pin;
the latch further including a hook configured to pivot to engage the enclosure when the latch is in the closed position and to pivots to release the enclosure when the latch is in the open position; and
each of the latch modules further including a spring to bias the latch module toward the closed position.

* * * * *